(12) United States Patent
Yen

(10) Patent No.: US 7,801,193 B2
(45) Date of Patent: Sep. 21, 2010

(54) LASER DIODE MODULE WITH AN ADJUSTABLE MONITORING CURRENT

(75) Inventor: Hsien-Cheng Yen, Dasi Township, Taoyuan County (TW)

(73) Assignee: Arima Lasers Corporation, Taoyuan County (TW)

( * ) Notice: Subject to any disclaimer, the term of this patent is extended or adjusted under 35 U.S.C. 154(b) by 0 days.

(21) Appl. No.: 12/071,298

(22) Filed: Feb. 20, 2008

(65) Prior Publication Data

US 2009/0207870 A1 Aug. 20, 2009

(51) Int. Cl.
*H01S 3/00* (2006.01)
(52) U.S. Cl. ............... 372/38.1; 372/38.01; 372/38.02; 372/38.03
(58) Field of Classification Search ...... 372/38.1–38.03
See application file for complete search history.

(56) References Cited

U.S. PATENT DOCUMENTS

| | | | | | |
|---|---|---|---|---|---|
| 5,309,463 | A | * | 5/1994 | Kasai | ............... 372/38.02 |
| 5,408,483 | A | * | 4/1995 | Kasai et al. | ............... 372/31 |
| 6,445,670 | B1 | * | 9/2002 | Oshima | ............... 369/116 |
| 6,724,793 | B2 | * | 4/2004 | Nagara | ............... 372/38.02 |
| 2001/0020670 | A1 | * | 9/2001 | Hyoga | ............... 250/205 |
| 2003/0002552 | A1 | * | 1/2003 | Nagara | ............... 372/38.02 |
| 2003/0095579 | A1 | * | 5/2003 | Ito et al. | ............... 372/38.01 |
| 2007/0098027 | A1 | * | 5/2007 | Saitoh et al. | ............... 372/29.011 |

* cited by examiner

*Primary Examiner*—Minsun Harvey
*Assistant Examiner*—Phillip Nguyen
(74) *Attorney, Agent, or Firm*—Rosenberg, Klein & Lee

(57) ABSTRACT

A laser diode module with an adjustable monitoring current, wherein the photo diodes monitoring the light-emitting power of the laser diode are arranged in array, and wherein a programmed photo diode is formed by the photo diodes in match of a memory and switch control unit. In this way, the problem of an inconstant monitoring current of the prior art is avoided. Meanwhile, an adjustable monitoring current is achieved.

1 Claim, 3 Drawing Sheets

LASER DIODE MODULE WITH AN ADJUSTABLE MONITORING CURRENT

BACKGROUND OF THE INVENTION

1. Field of the Invention

The invention relates to a laser diode module with an adjustable monitoring current, and more particularly to a photo diode arranged in array.

2. Description of the Related Art

Generally, a laser diode is provided with a photo diode. As shown in FIGS. 1 and 2, the photo diode is employed to receive the light emitted from the rear end of the laser diode, thereby creating a monitoring current. Theoretically, the light-emitting ratio of the front and read ends of the laser diode is a fixed value. Therefore, the monitoring current created by the photo diode can be used for the automatic power control circuit 10 to monitor the light-emitting power of the laser diode. When the power of the laser diode drops due to the rise of the ambient temperature, the power of the light shining on the photo diode is also decreased. As a result, the monitoring current is reduced as well. Thus, the automatic power control circuit 10 can duly adjust the current supplied to the laser diode according to the change of the monitoring current such that the output power of the laser diode may remain unchanged.

Due to the individual difference of the laser diode, the photo diode, and the packaging, each of the produced laser diode modules has different monitoring current. Therefore, the application terminal has to employ a variable resistance for producing a fixed monitoring voltage. However, the cost of the variable resistance is too high. When a fixed resistance is employed, the laser diode module has to be divided into many groups according to the created values of the monitoring current for obtaining a stable power output.

SUMMARY OF THE INVENTION

An object of the invention is to eliminate the above-mentioned drawbacks and to provide a laser diode module with an adjustable monitoring current.

In order to achieve the above-mentioned object, the photo diode is arranged in array or connected to array resistance. Meanwhile, an automatic power control circuit is employed for creating a programmed photo diode.

BRIEF DESCRIPTION OF THE DRAWINGS

The accomplishment of this and other objects of the invention will become apparent from the following descriptions and its accompanying figures of which.

DETAILED DESCRIPTION OF THE PREFERRED EMBODIMENT

Figure 1:
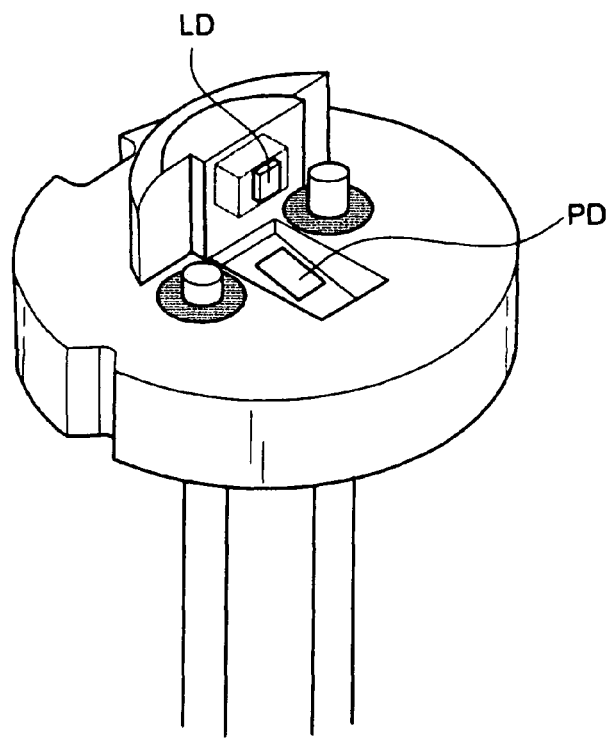
FIG. 1 is a perspective view of the structure of a conventional laser diode.
Figure 2:
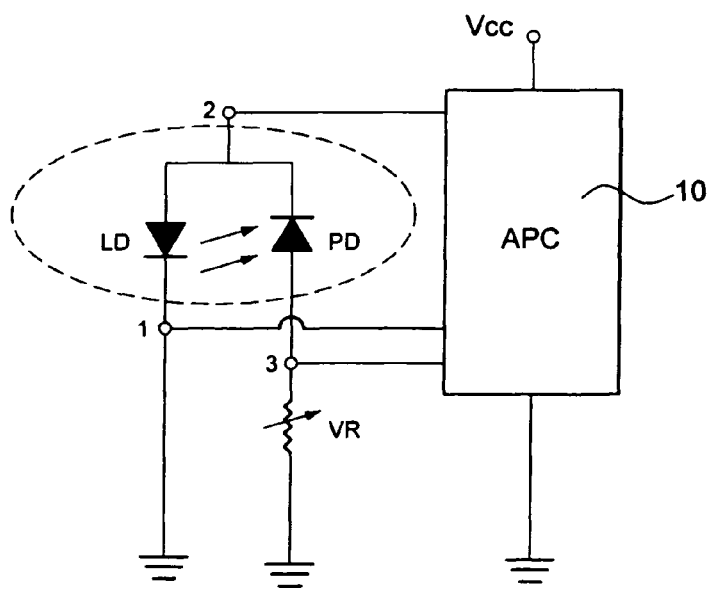
FIG. 2 is a diagram of circuit for monitoring the power of the conventional laser diode.
Figure 3:
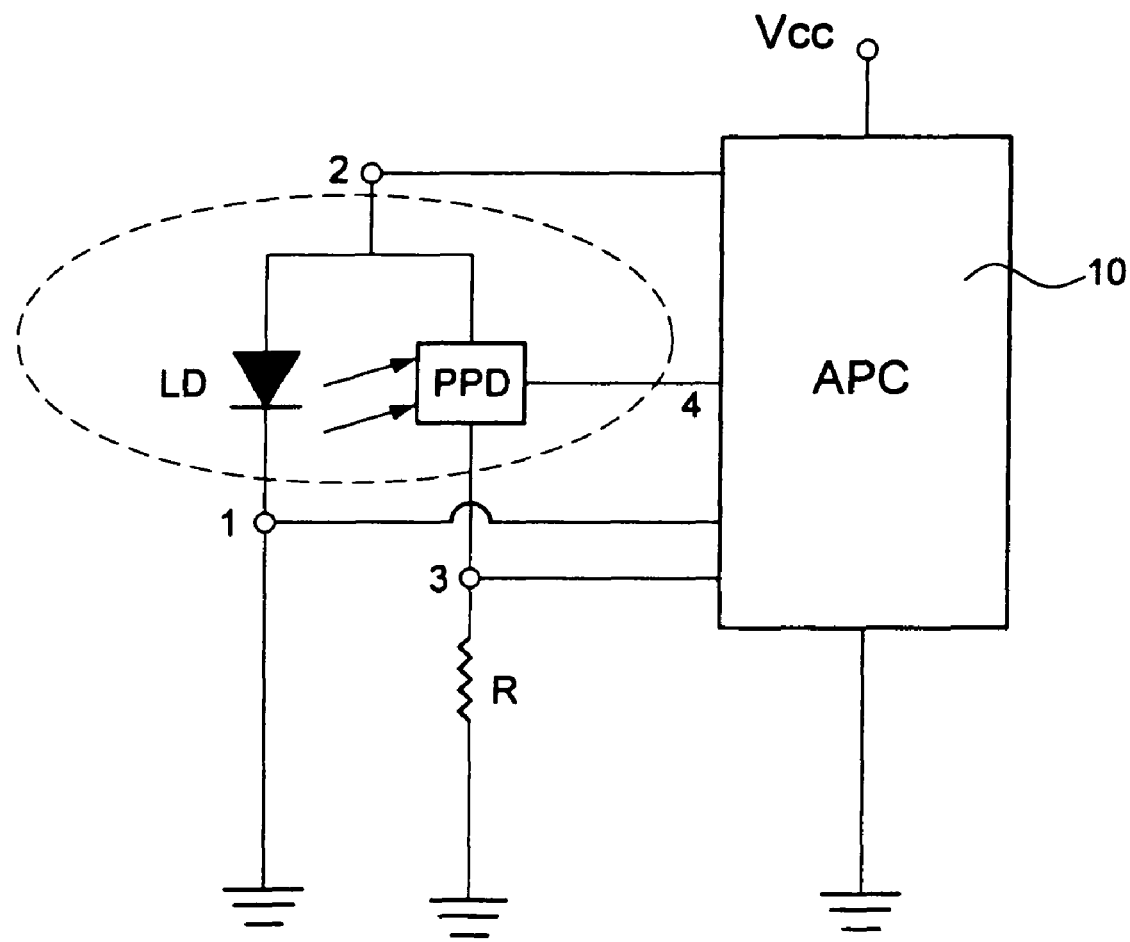
FIG. 3 is a diagram of circuit for monitoring the power of the conventional laser diode in accordance with the invention.
Figure 4:
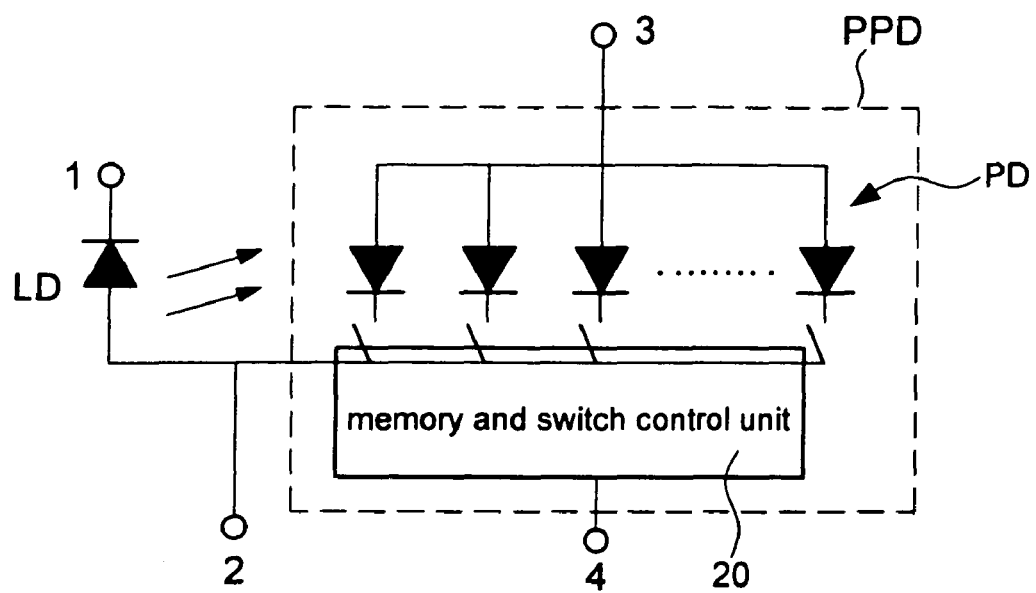
FIG. 4 is a schematic drawing of a first embodiment of the invention.

First of all, referring to FIG. 3, a photo diode in accordance with the invention is designed to be a programmed photo diode and then connected to an external automatic power control circuit 10 such that the application terminal can be matched with a common resistance R. In accordance with a first embodiment shown in FIG. 4, the photo diodes monitoring the light-emitting power of the laser diode are arranged in array. A programmed photo diode is formed by the photo diodes in match of a memory and switch control unit 20.

Figure 5:
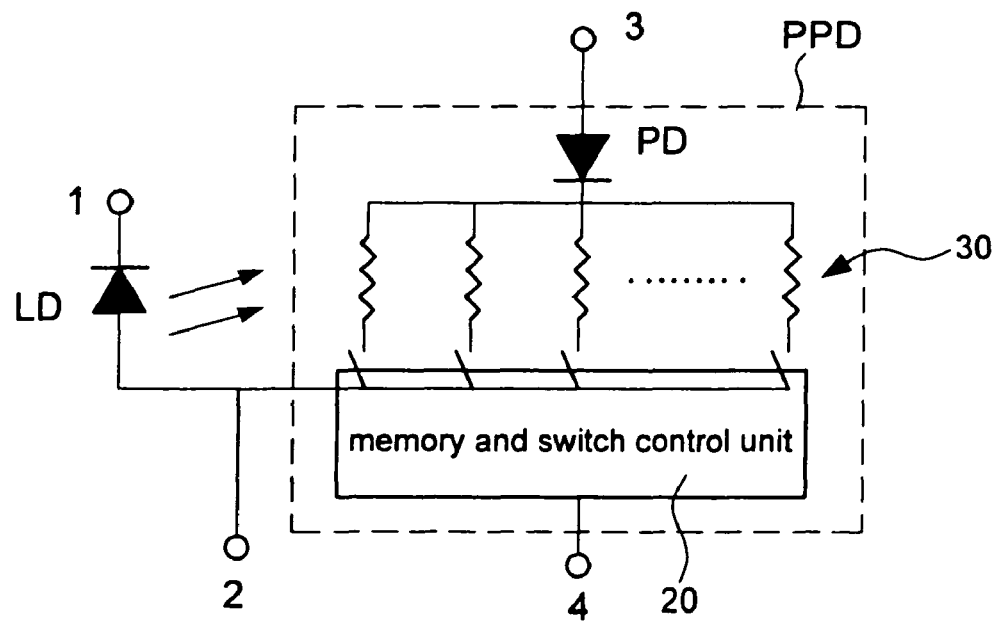
FIG. 5 is a schematic drawing of a second embodiment of the invention.

In accordance with a second embodiment of the invention shown in FIG. 5, the photo diode monitoring the light-emitting power of the laser diode is connected with array resistances 30, the array resistances 30 in match of a memory and switch control unit 20, thereby forming the programmed photo diode.

Based upon the above-mentioned configuration, the memory and switch control unit 20 allows some photo diodes of the array photo diodes or some resistances of the array resistances to be switched on. The created monitoring current value is exactly distributed under 5 .mu.A of total range.

Many changes and modifications in the above-described embodiments of the invention can, of course, be carried out without departing from the scope thereof. Accordingly, to promote the progress in science and the useful arts, the invention is disclosed and is intended to be limited only by the scope of the appended claims.

What is claimed is:

1. A laser diode module with an adjustable monitoring current, the laser module comprising:
    a laser diode;
    a photo diode positioned to receive light from said laser diode;
    an array of exclusively fixed value resistors; and
    an automatic power control circuit for monitoring the current supplied to the laser diode;
    wherein the photo diode monitoring the light-emitting power of the laser diode is connected in series with the array of fixed value resistors, and the array of fixed value resistors in match of a memory and switch control unit, thereby forming the programmed photo diode.

* * * * *